(12) United States Patent
Schonhardt et al.

(10) Patent No.: US 12,707,586 B2
(45) Date of Patent: Aug. 11, 2026

(54) AUTOMATION FIELD DEVICE

(71) Applicant: Endress+Hauser SE+Co. KG, Maulburg (DE)

(72) Inventors: Raphael Schonhardt, Rheinfelden (DE); Michael Lais, Schönau im Schwarzwald (DE); Vitogiuseppe Di Cosola, Hartheim (DE); Simon Gerwig, Schopfheim (DE); Christian Strittmatter, Rickenbach (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 203 days.

(21) Appl. No.: 18/687,390

(22) PCT Filed: Jul. 27, 2022

(86) PCT No.: PCT/EP2022/071050
§ 371 (c)(1),
(2) Date: Feb. 28, 2024

(87) PCT Pub. No.: WO2023/030770
PCT Pub. Date: Mar. 9, 2023

(65) Prior Publication Data

US 2024/0365496 A1 Oct. 31, 2024

(30) Foreign Application Priority Data

Aug. 31, 2021 (DE) ..................... 10 2021 122 566.3

(51) Int. Cl.
*H05K 7/10* (2006.01)
*H05K 7/14* (2006.01)

(52) U.S. Cl.
CPC ............. *H05K 7/1462* (2013.01); *H05K 7/10* (2013.01)

(58) Field of Classification Search
None
See application file for complete search history.

(56) References Cited

U.S. PATENT DOCUMENTS 5,524,492 A * 6/1996 Frick .................. G01L 19/0038 73/706
5,606,513 A * 2/1997 Louwagie .............. G01L 9/045 702/138

(Continued)

FOREIGN PATENT DOCUMENTS

DE 102014114641 A1 4/2016
DE 102015110350 A1 12/2016

(Continued)

*Primary Examiner* — Xanthia C Relford
(74) *Attorney, Agent, or Firm* — Kelly J. Smith; Endress+Hauser (USA) Holding, Inc.

(57) ABSTRACT

An automation field device includes a metallic field device housing enclosing an interior; a sensor element and/or actuator element placed on one side on the field device housing, —for actuating and/or acquiring a process variable; an electronic circuit that is arranged in the interior of the field device housing and is configured to provide and/or process a sensor and/or actuator signal for and/or from the sensor element and/or actuator element, the electronic circuit furthermore having at least one field contact plug for transmitting data and/or energy, the field contact plug being guided outward through an opening in the field device housing, a custom-fit plug sleeve being plugged over the field contact plug, said plug sleeve being welded onto the field device housing and being fastened to a retaining means arranged in the interior.

6 Claims, 2 Drawing Sheets

(56) References Cited

U.S. PATENT DOCUMENTS 5,665,899 A * 9/1997 Willcox ................ G01L 27/007 73/1.63
5,670,722 A * 9/1997 Moser ................. G01L 19/0084 73/756
7,190,053 B2 * 3/2007 Orth ..................... H05K 7/1462 257/659
8,371,175 B2 * 2/2013 Romo ................. G01L 19/0007 73/756
9,638,600 B2 * 5/2017 Haywood ........... G01L 19/0069
10,545,064 B2 * 1/2020 Petrarca ................ G01L 9/0052
10,663,931 B2 * 5/2020 Perrault ............... G01D 11/245
10,811,806 B2 * 10/2020 Trenkamp ............ H01R 13/518
11,012,116 B2 * 5/2021 Schäuble ................. H04Q 9/00
2005/0145035 A1 * 7/2005 Kopp .................... G01L 19/148 73/756
2006/0042393 A1 * 3/2006 Kaneko ................. G01L 19/148 73/753
2011/0317390 A1 * 12/2011 Moser .................. G01D 11/245 361/679.01
2013/0141888 A1 * 6/2013 Wittmer ............... H05K 7/1462 361/818
2013/0321011 A1 * 12/2013 Binder ................. G01R 31/003 324/750.01
2017/0188472 A1 * 6/2017 Grozinger ............ H05K 5/0026
2018/0160574 A1 * 6/2018 Michalski ............ H05K 7/1462
2018/0249587 A1 * 8/2018 Seiler ................... H05K 7/1462
2018/0299239 A1 * 10/2018 Eitschberger .......... H05K 5/069
2019/0391031 A1 * 12/2019 Kawase ................ G01L 19/148
2020/0003647 A1 * 1/2020 Sugahara .............. G01L 19/147
2020/0249056 A1 * 8/2020 Osswald ................ G01D 11/30
2020/0400717 A1 * 12/2020 Bechtel ................ G01R 1/0416

FOREIGN PATENT DOCUMENTS

DE 102019119426 A1 1/2021
EP 1790204 B1 12/2016
EP 3314701 B1 8/2019

* cited by examiner

AUTOMATION FIELD DEVICE

CROSS-REFERENCE TO RELATED APPLICATIONS

The present application is related to and claims the priority benefit of DPMA Patent Application No. 10 2021 122 566.3, filed on Aug. 31, 2021, and International Patent Application No. PCT/EP2022/071050, filed Jul. 27, 2022, the entire contents of which are incorporated herein by reference.

TECHNICAL FIELD

The invention relates to a field device in automation.

BACKGROUND

Field devices that are used in industrial systems are known from the prior art. Field devices are often used in process automation engineering, as well as in manufacturing automation engineering. In principle, all devices which are process-oriented and which supply or process process-relevant information are referred to as field devices. Field devices are thus used for detecting and/or influencing process variables. Measuring devices, or sensors, are used for detecting process variables. These are used for example for pressure and temperature measurement, conductivity measurement, flow measurement, etc., and record corresponding process variables of pressure, temperature, conductivity, pH, fill level, flow, etc. Actuators are used for influencing process variables. These are, for example, pumps or valves that can influence the flow of a fluid in a pipe or the fill level in a tank. In addition to the aforementioned measuring devices and actuators, field devices are also understood to include remote I/Os, radio adapters, or, generally, devices that are arranged at the field level.

A multitude of such field devices is produced and marketed by the Endress+Hauser group.

In hygienic processes, particularly high demands are made with regard to their processing and/or cleanliness. Examples of such hygienic processes are applications in the food industry where there is a risk that deposits and/or contaminants can affect shelf life and/or lead to contamination of food that is hazardous to health.

In order to meet these requirements, the housings of field devices have a specific design. For example, they are manufactured from a metal material, such as 316L stainless steel, and/or designed such that there are as few points as possible where deposits and/or contaminants can adhere.

Field contact plugs that are introduced into the housing are usually used to connect such field devices. The field contact plug is usually integrated by a welding operation in which a plug sleeve of the field contact plug is welded on from the outside by a laser. Due to the small contour to be welded and the non-radial weld seam, it is not possible here, as is otherwise customary, to use a hold-down device on the welding installation, because the interference contour of the hold-down device would be too large to perform the welding.

SUMMARY

The object of the invention is to provide a possible way of welding a plug connector to a field device housing from the outside without requiring a hold-down device.

The object is achieved by the automation field device according to the present disclosure.

The automation field device according to the invention at least comprises:

- a metal field device housing enclosing an inner chamber;
- a sensor element and/or actuator element arranged on one side of the field device housing for setting and/or recording a process variable;
- an electronic circuit that is arranged, at least in part, in the inner chamber of the field device housing and is configured to provide and/or process a sensor and/or actuator signal for and/or from the sensor element and/or actuator element, the electronic circuit furthermore having at least one field contact plug for transmitting data and/or energy, the field contact plug being guided outward through an opening in the field device housing, a custom-fit plug sleeve being placed over the field contact plug, said plug sleeve being welded onto the field device housing and being fastened to a retaining means that is arranged in the interior.

According to the invention, it is proposed to fasten the plug sleeve of the field contact plug to a retaining means located in the inner chamber of the field device housing so as to hold it in position when the plug sleeve is subsequently welded onto the field device housing. This prevents the field contact plug from being affected by the dynamics of the welding system or the influence of inert gas streams, etc. during the welding operation. Furthermore, a laser beam has free access to the welding point because there is no longer a need for a hold-down device. Another advantage is also that installation can take place blindly.

An advantageous embodiment of the automation field device according to the invention provides that the retaining means is an electronics cup made of a plastics, which is substantially adapted to match a contour of the field device housing and is arranged in the inner chamber, and wherein the electronic circuit is arranged, at least in part, in the electronics cup. In particular, the embodiment can provide that the electronic circuit is potted, at least in part, with a potting compound introduced into the electronics cup.

Another advantageous embodiment of the automation field device according to the invention provides that, for fastening purposes, the retaining means has a first fastening device and the plug sleeve has a second fastening device, which are adapted to match one another in such a way that the first and second fastening devices can be clipped, latched or clamped into one another. In particular, the embodiment can provide that the retaining means has a latching geometry as a first fastening element, and the plug sleeve has a groove as a second fastening device, wherein the latching element and the groove are adapted to match one another in such a way that they engage in one another by simple clipping, latching or clamping. Furthermore, the embodiment can provide that the latching geometry is molded onto the electronics cup.

Another advantageous embodiment of the automation field device according to the invention provides that the field contact plug is a circular connector, for example an M12 circular connector, a cable gland or an Ethernet plug.

BRIEF DESCRIPTION OF THE DRAWINGS

The present disclosure is explained in more detail on the basis of the following drawings.

In the figures.

DETAILED DESCRIPTION

Figure 1:
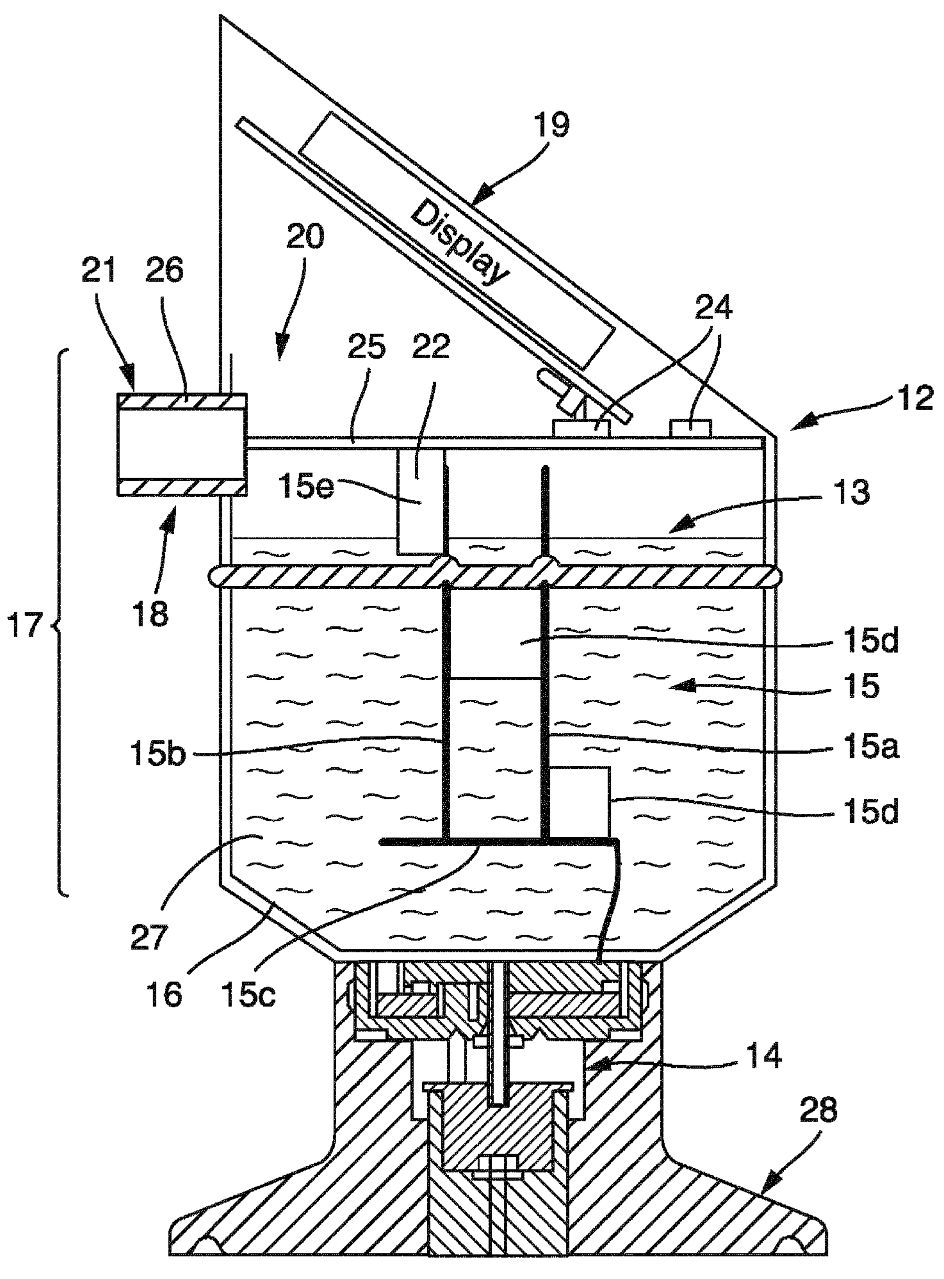
FIG. 1 shows a schematic sectional view through an automation field device.

FIG. 1 is a schematic sectional view through an automation field device 10. The field device 10 comprises a field device housing 12 that encloses an inner chamber 13. The field device housing 12 has a region 17 that is rotationally symmetrical at least in portions and in which the field contact plug 21 is or is to be integrated. The field device 10 further comprises a sensor assembly arranged at the end of the field device housing 12 with a sensor and/or actuator element 14 for setting and/or recording a process variable and a process connector 28. The process connector 18 can be a threaded connector or a flange that can be screwed on or clamped on.

In the present embodiment, the sensor and/or actuator element 14 comprises a fill level sensor element for recording a fill level as a process variable. Nevertheless, the invention is not limited to the type or specific design of the sensor element and/or actuator element as a fill level sensor element, but can in principle be applied to any other sensor or actuator principle.

An electronic circuit 15, which is introduced into an inner chamber 13 of the field device housing and is designed to operate the sensor and/or actuator element 14, serves to provide and/or process a sensor signal and/or actuator signal.

In the present embodiment, the electronic circuit has three printed circuit boards, of which two printed circuit boards 15*a* and 15*b* are arranged in the longitudinal direction of the housing and one printed circuit board 15*c* is arranged in the transverse direction relative to the housing. The printed circuit boards 15*a*, 15*b*, 15*c* are plugged into one another via corresponding plug connectors and mating connectors 15*d* and are thus electrically contacted. Plug connectors and mating connectors can be designed as either rigid or flexible connectors. Plug connectors and mating connectors can also be interchanged.

The electronic circuit further comprises interface electronics 20 having at least one first printed circuit board 25 having a field contact plug 21, which is arranged on a printed circuit board edge in a longitudinal axis of the printed circuit board 25 and is soldered thereto. The field contact plug 21 transmits data, in particular measured values, and/or energy from the field device 10 to an external unit, for example a superordinate unit or another field device.

The field contact plug 21 can in particular be a circular connector, for example an M12 circular connector. However, it can also be other common plug connectors that are suitable for transmitting data and/or energy. For example, it can also be an Ethernet plug. Furthermore, the field contact plug 21 can also be a cable gland through which a line for electrical contact is passed into the inner chamber of the field device.

The interface electronics 20 further comprises at least one mating connector 22 that can be arranged on and attached to the first printed circuit board 25 in such a way that a plug-in shaft 23 is inclined or tilted relative to a main plane in which the first printed circuit board 25 is formed. Via the mating connector 22 of the interface electronics, the latter is connected to one of the printed circuit boards of the electronic circuit via a matching plug connector 15*e* provided there. Plug connectors and mating connectors can be designed as either rigid or flexible connectors. Plug connectors and mating 20) connectors can also be interchanged. Furthermore, electronic components for EMC and/or explosion protection measures 24 can be mounted on the first printed circuit board 25.

The electronic circuit 15 located in the field device 10 is arranged, at least in part, in an electronics cup 16, which has a fixed seat in the field device housing and, if necessary, is also used to fix the printed circuit boards of the electronic circuit. The electronics cup 16 is thereby substantially adapted to an outer contour of the field device housing. Furthermore, the electronic circuit portions located in the electronics cup can be potted by means of a potting compound 27.

Figure 2:
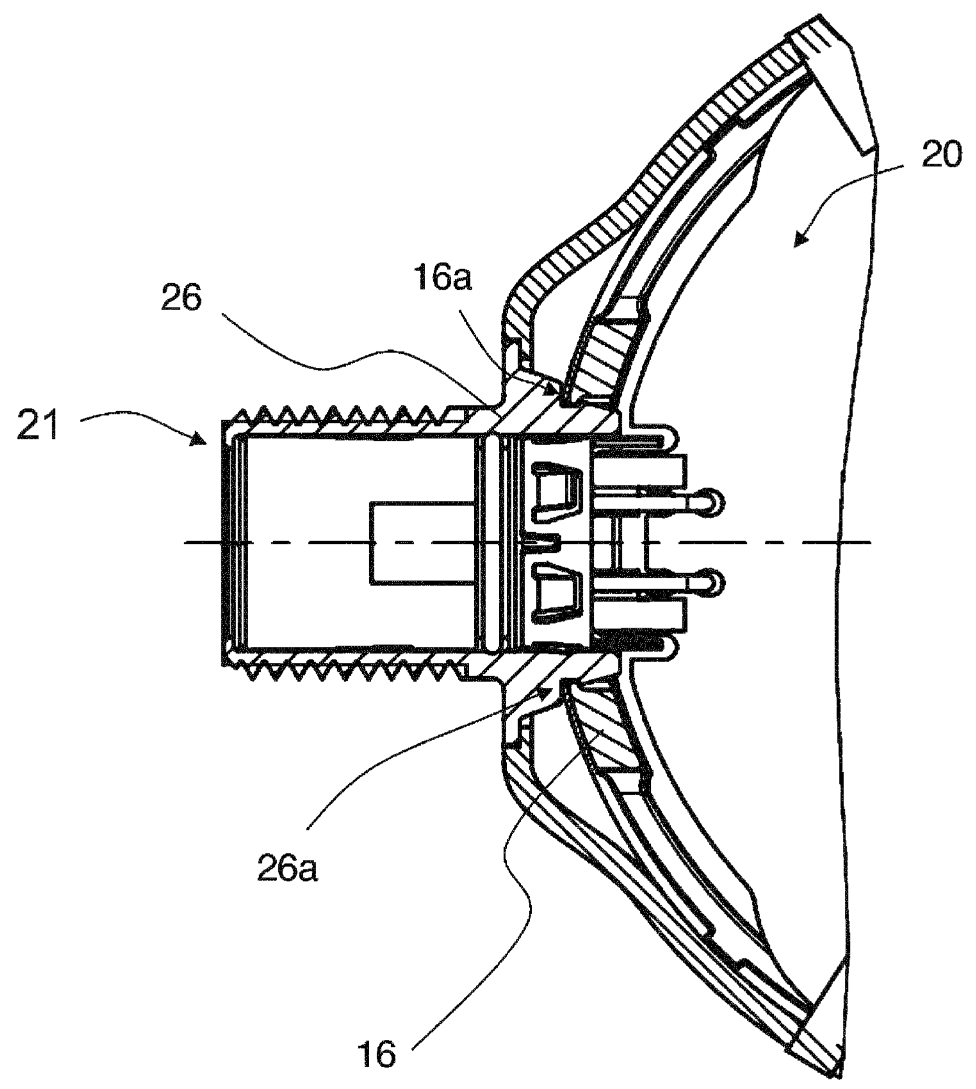
FIG. 2 shows a detailed view of the latching mechanism on the plug sleeve and the electronics cup of the field device.

The field device housing 12 also has a housing opening 18 through which the field contact plug is guided to the outside. For mechanical fixing and/or alignment or positioning, a custom-fit plug sleeve 26 is mounted over the field contact plug in or on the field device housing 12. The plug sleeve 26 is welded to the outside of the field device housing. In order to fix the plug sleeve during the welding operation, it is fastened to the electronics cup by means of a fastening device, as shown in FIG. 2. This can take place, for example, by means of a latching mechanism on the electronics cups arranged in the field device housing. For example, a first fastening element can be realized by a latching geometry molded onto the electronics cup, for example in the form of a latching lug. To allow for latching or clipping, a circumferential groove is formed in the plug sleeve as a second fastening element. The interaction of the two fastening elements prevents the field contact plug from being affected during the welding operation, for example by the dynamics of the welding system or the influence of inert gas streams, because the plug sleeve is fixed to the electronics cup. Furthermore, a laser beam has free access to the welding point.

Depending on the place of use, the field device may also comprise a display 19 and further electronic components, as shown in FIG. 1.

The invention claimed is:

1. An automation field device at least comprising:

a metal field device housing enclosing an inner chamber;

a sensor element and/or actuator element, arranged on one side of the field device housing, for setting and/or recording a process variable;

an electronic circuit that is arranged, at least in part, in the inner chamber of the field device housing and is configured to provide and/or process a sensor and/or actuator signal for and/or from the sensor element and/or actuator element, wherein the electronic circuit furthermore has at least one field contact plug for transmitting data and/or energy, wherein the field contact plug is guided outward through an opening in the field device housing, wherein a custom-fit plug sleeve is placed over the field contact plug and is welded onto the field device housing and wherein the plug sleeve is fastened to a retaining means that is arranged in the inner chamber;

wherein the retaining means is an electronics cup made of a plastics, which is substantially adapted to match an outer contour of the field device housing and is arranged in the inner chamber, and wherein the electronic circuit is arranged, at least in part, in the electronics cup.

2. The automation field device according to claim 1, wherein the electronic circuit is potted at least partially with a potting compound introduced into the electronics cup.

3. The automation field device according to claim 1, wherein, for fastening purposes, the retaining means has a first fastening device and the plug sleeve has a second fastening device, which are adapted to match one another in such a way that the first and second fastening devices can be clipped, latched or clamped into one another.

4. The automation field device according to claim 3, wherein the retaining means has a latching geometry as a first fastening element, and the plug sleeve has a groove as a second fastening device, wherein the latching element and the groove are adapted to match one another in such a way that they engage in one another by simple clipping, latching or clamping.

5. The automation field device according to claim 4, wherein the latching geometry is molded onto the electronics cup.

6. The automation field device according to claim 1, wherein the field contact plug is a circular connector, a cable gland or an Ethernet plug.

* * * * *